(12) United States Patent
Sugiyama et al.

(10) Patent No.: US 8,811,021 B2
(45) Date of Patent: Aug. 19, 2014

(54) ELECTRONIC CIRCUIT MODULE

(71) Applicant: Taiyo Yuden Co., Ltd., Tokyo (JP)

(72) Inventors: Yuichi Sugiyama, Tokyo (JP); Tatsuro Sawatari, Tokyo (JP); Masashi Miyazaki, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/073,019

(22) Filed: Nov. 6, 2013

(65) Prior Publication Data

US 2014/0126160 A1     May 8, 2014

(30) Foreign Application Priority Data

Nov. 7, 2012   (JP) ................................. 2012-245166

(51) Int. Cl.
    *H01L 23/552*       (2006.01)
(52) U.S. Cl.
    USPC ............................ 361/746; 257/659; 257/678
(58) Field of Classification Search
    USPC .......... 361/746, 796, 800, 816; 257/659, 660, 257/678; 174/350
    See application file for complete search history.

(56) References Cited

U.S. PATENT DOCUMENTS

| | | | | |
|---|---|---|---|---|
| 7,906,371 | B2* | 3/2011 | Kim et al. | 438/113 |
| 8,476,115 | B2* | 7/2013 | Choi et al. | 438/118 |
| 2008/0210462 | A1 | 9/2008 | Kawagishi et al. | |
| 2011/0248389 | A1* | 10/2011 | Yorita et al. | 257/659 |

FOREIGN PATENT DOCUMENTS

| | | |
|---|---|---|
| JP | 2004-146419 A | 5/2004 |
| JP | 2009-004584 A | 1/2009 |
| JP | 2011-187830 A | 9/2011 |
| WO | 2007/060784 A1 | 5/2007 |

\* cited by examiner

*Primary Examiner* — Angel R Estrada
*Assistant Examiner* — Dimary Lopez Cruz
(74) *Attorney, Agent, or Firm* — Fitch, Even, Tabin & Flannery, LLP

(57) ABSTRACT

There is provided an electronic circuit module that prevents a bonding force between ground wiring and a shield from decreasing and maintains successfully a desirable shield effect. The electronic circuit module includes a core layer also functioning as the ground wiring, each face OS of each first protrusion of the core layer facing to an end face of a shield is adjacent to faces OS of an outer cover made of an insulating synthetic resin facing to the end face of the shield, and the end face of the shield is bonded to both of the each face OS of each first protrusion facing to the end face of the shield and the faces OS of the outer cover facing to the end face of the shield.

7 Claims, 4 Drawing Sheets

ELECTRONIC CIRCUIT MODULE

CROSS-REFERENCE TO A RELATED APPLICATION

This application claims priority under 35 U.S.C. §119 to Japanese Patent Application No. JP 2012-245166 filed on Nov. 7, 2012, the entire content of which is hereby incorporated herein by reference in its entirety.

FIELD

The present disclosure relates to an electronic circuit module including a sealing portion covering a mount component mounted on a substrate with built-in component, and a shield covering the sealing portion.

BACKGROUND

This kind of an electronic circuit module includes a substrate with built-in component, mount components mounted on the substrate with built-in component, a sealing portion covering the mount components, and a shield covering the sealing portion as shown in FIG. 3 in Japanese Patent Application Laid-open No. 2009-004584. In the electronic circuit module, predetermined electronic circuits including built-in components and mount components are three-dimensionally constructed. The shield is connected to ground wiring of the substrate with built-in component, and prevents noises from outside.

In general, the shield in the above-described electronic circuit module is formed of a metal. If the shield is formed of a conductive synthetic resin, the following defects may be induced. In other words, a bonding force between the metal and the synthetic resin tends to be lower than that between the metals or the synthetic resins. If the shield is formed of the conductive synthetic resin, the bonding force between the shield and the ground wiring made of a metal is decreased over time, which induces a local peeling at a boundary. As a result, a conduction property between the shield and the ground wiring is decreased and a desirable shield effect is not easily obtainable.

SUMMARY

In view of the above-described circumstances, it is desirable to provide an electronic circuit module that prevents a bonding force between ground wiring and a shield from decreasing to avoid a decrease in conduction therebetween and maintains successfully a desirable shield effect, even when the ground wiring of a substrate with built-in component is made of a metal and the shield is made of a conductive synthetic resin.

According to an embodiment of the present disclosure, there is provided an electronic circuit module including a substrate with built-in component; a mount component mounted on the substrate with built-in component; a sealing portion covering the mount component; and a shield made of a conductive synthetic resin covering the sealing portion, the substrate with built-in component having a core layer made of a metal also functioning as ground wiring, an outer cover made of an insulating synthetic resin covering a side face of the core layer, and a first protrusion integrated with the core layer that protrudes outwardly from the side face of the core layer and has an end face exposed at the outer cover, a face of the first protrusion facing to an end face of the shield being adjacent to a face of the outer cover facing to the end face of the shield, and the end face of the shield bonded to both of the face of the first protrusion facing to the end face of the shield and the face of the outer cover facing to the end face of the shield.

According to the present disclosure, there is provided an electronic circuit module that prevents a bonding force between ground wiring and a shield from decreasing to avoid a decrease in conduction therebetween and maintains successfully a desirable shield effect, even when the ground wiring of a substrate with built-in component is made of a metal and the shield is made of a conductive synthetic resin.

These and other objects, features and advantages of the present disclosure will become more apparent in light of the following detailed description of best mode embodiments thereof, as illustrated in the accompanying drawings.

DETAILED DESCRIPTION OF THE EMBODIMENTS

Structure of Electronic Circuit Module

Figure 1:
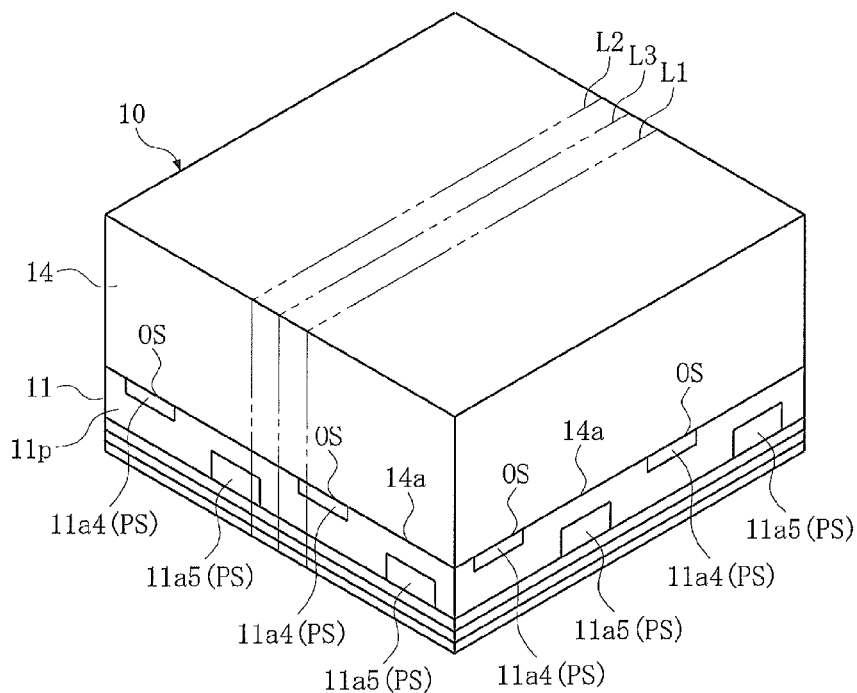
FIG. 1 is a perspective view of an electronic circuit module according to an embodiment of the present disclosure.

An electronic circuit module 10 shown in FIGS. 1 to 5 includes a substrate 11 with built-in component, mount components 12 mounted on the substrate 11 with built-in component, a sealing portion 13 covering the mount components 12 and a shield 14 covering the sealing portion 13. A predetermined electronic circuit including built-in components 11b and the mount components 12 is three-dimensionally constructed.

Figure 2:
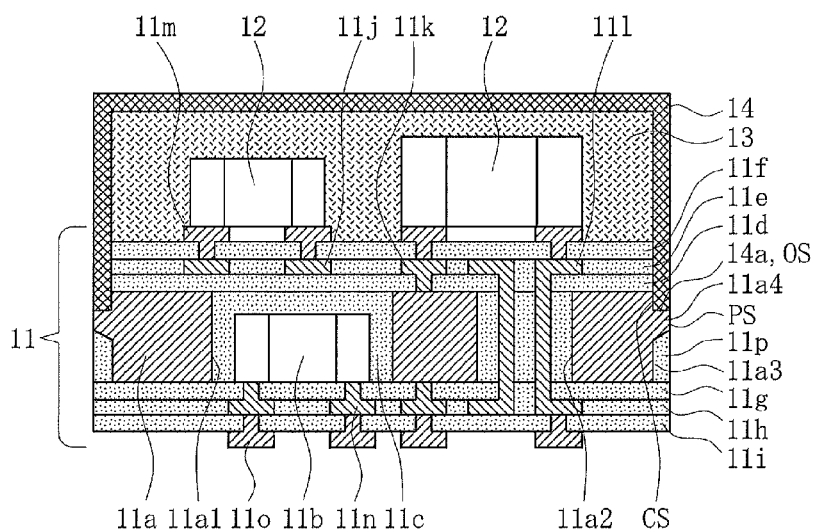
FIG. 2 is a longitudinal sectional view along the line L1 of FIG. 1.
Figure 3:
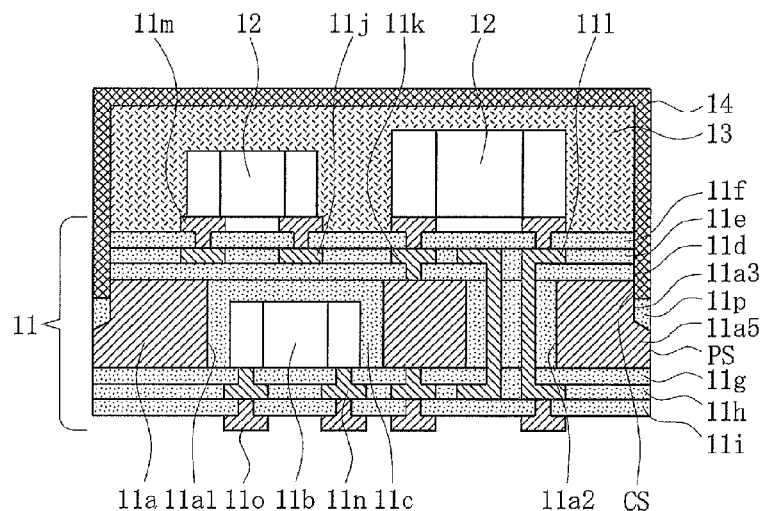
FIG. 3 is a longitudinal sectional view along the line L2 of FIG. 1.
Figure 4:
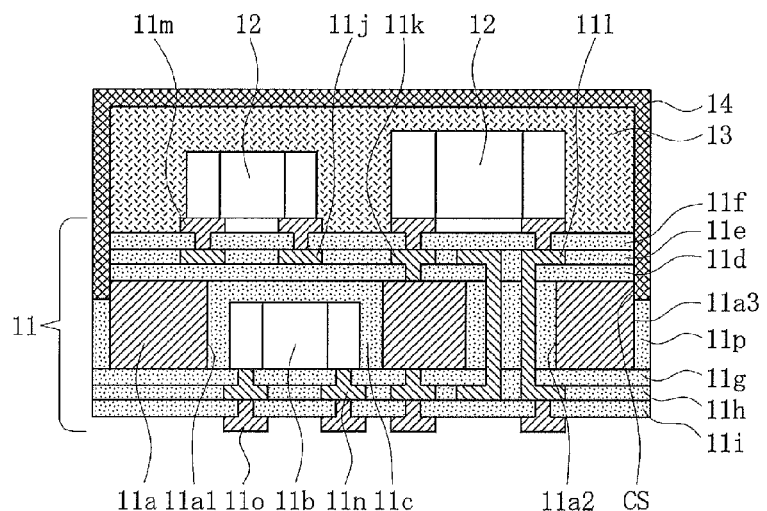
FIG. 4 is a longitudinal sectional view along the line L3 of FIG. 1.

Positions of the longitudinal sectional views shown in FIGS. 2 to 4 (see the lines L1 to lines L3 of FIG. 1) are different. As a matter of convenience, section structures shown in FIGS. 2 to 4 are the same excluding a side of a core layer 11a described later.

In each section structure shown in FIGS. 2 to 4, the substrate 11 with built-in component includes the core layer 11a, a built-in component 11b stored in a storage portion 11a1 disposed within the core layer 11a, an insulation portion 11c disposed in a space between the built-in component 11b and the storage portion 11a1, three insulation layers 11d to 11f disposed at an upper surface (one face in a thickness direction) of the core layer 11a, and three insulation layers 11g to 11i disposed at a bottom layer (the other face in the thickness direction) of the core layer 11a. Although FIGS. 2 to 4 show the storage portion 11a1 having penetrating holes, the storage portion 11a1 having no penetrating holes may be used as long as the built-in components 11b can be stored.

The insulation layer 11e has two signal wirings 11j, and a T type conductor via 11k penetrating through the insulation layer 11d. The insulation layers 11e and 11h have an I type conductor via 11l penetrating through the insulation layer 11d, the core layer 11a and the insulation layer 11g such that the I type conductor via 11l is not contacted with the core layer 11a. At an upper surface of the insulation layer 11f, four T type conductor vias 11m are disposed penetrating through the insulation layer 11f. At the insulation layer 11h, three T type conductor vias 11n are disposed penetrating through the insulation layer 11g. At a lower surface of the insulation layer 11i, four T type conductor vias 11o are disposed penetrating through the insulation layers 11ih. Although no symbols are added, an insulation portion is disposed in a space between the conductor via 11l and an inner wall of a penetrating hole 11a2, and an insulation portion is also disposed in a space within the conductor via 11l.

Further, a lower surface of the conductor via 11k is connected to an upper surface of the core layer 11a, lower surfaces of the two conductor vias 11m among the four conductor vias 11m are connected to upper surfaces of two signal wirings 11d, a lower surface of one conductor via 11m among the rest two conductor vias 11m is connected to an upper surface of the conductor via 11k, and a lower surface of the rest one conductor via 11m is connected to an upper surface of the conductor via 11l. Upper surfaces of the two conductor vias 11n among the three conductor vias 11n are connected to terminals of the built-in component 11b, and an upper surface of the rest one conductor via 11n is connected to a lower surface of the core layer 11a. Upper surfaces of the two conductor vias 11o among the four conductor vias 11o are connected to lower surfaces of the two conductor vias 11n, an upper surface of one conductor via 11o among the rest two conductor vias 11o is connected to a lower surface of the one conductor via 11n, and an upper surface of the rest one conductor via 11o is connected to a lower surface of the conductor via 11l.

Although not shown in the section structures shown in FIGS. 2 to 4, the substrate 11 with built-in component includes signal wirings and conductor vias other than those described above, and also includes the ground wiring other than the core layer 11a.

The core layer 11a is made of a metal such as copper and a copper alloy, has a thickness, for example, of 35 to 500 μm, and also functions as the ground wiring. The built-in component 11b is an electronic component such as a capacitor, an inductor, a resistor, a filter chip and an IC chip. In FIGS. 2 to 4, one built-in component 11b is shown, but the number of the built-in component 11b is not especially limited.

Each of the insulation layers 11d to 11f and 11g to 11i is made of an insulating thermosetting synthetic resin including an epoxy resin, polyimide, a bismaleimide triazine resin or the above-described resin containing a reinforcing filler such as glass fiber, and has a thickness, for example, of 5 to 50 μm. Also, the insulation portion 11c, the insulation portion (no symbol) disposed in the space between the conductor via 11l and an inner wall of the penetrating hole 11a2, and the insulation portion (no symbol) disposed in the space within the conductor via 11l are made of an insulating thermosetting synthetic resin including an epoxy resin, polyimide, a bismaleimide triazine resin or the above-described resin containing a reinforcing filler such as glass fiber.

Figure 5:
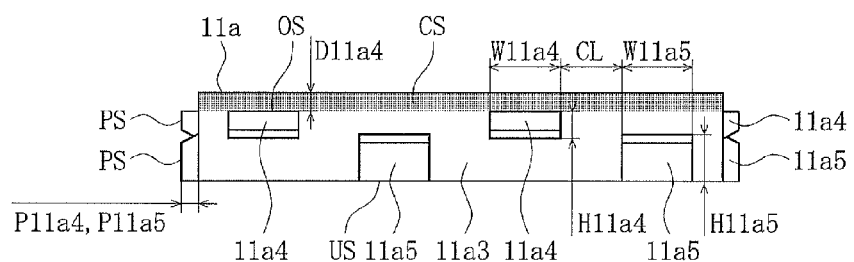
FIG. 5 is a sectional view of a core layer shown in FIGS. 2 to 4.

Here, referring to FIGS. 1 and 5, a structure of side faces of the core layer 11a will be described in detail. The core layer 11a has a substantially rectangular shape at an upper contour, and integrally has two first protrusions 11a4 and two second protrusions 11a5 that protrude outwardly from four side faces 11a3. The first protrusions 11a4 are positioned at an upper side of the core layer 11a in a thickness direction, and the second protrusions 11a5 are positioned at lower side of the core layer 11a in the thickness direction. The first protrusions 11a4 and the second protrusions 11a5 are arranged alternately staggered in the respective side faces 11a3 at spaces CL in a direction orthogonal to the thickness direction of the core layer 11a.

The first protrusions 11a4 and the second protrusions 11a5 are rectangular parallelepiped. A width W11a4 of the first protrusion 11a4 and a width W11a5 of the second protrusion 11a5 are almost same, and are within a range of 200 to 600 μm, for example. The space CL therebetween is also within a range of 200 to 600 μm, for example. A height H11a4 of the first protrusion 11a4 is lower than a height H11a5 of the second protrusion 11a5, the height H11a4 of the first protrusion 11a4 is within a range of 50 to 200 μm, for example, and the height H11a5 of the second protrusion 11a5 is within a range of 100 to 300 μm, for example. A protruded dimension P11a4 of the first protrusion 11a4 and a protruded dimension P11a5 of the second protrusion 11a5 are almost same, and are within a range of 50 to 200 μm, for example. End faces PS of the both are almost in parallel with the side faces 11a3 of the core layer 11a, and are almost in plane with respective end faces of the insulation layers 11g to 11i (see FIGS. 2 and 3). Each face OS of each first protrusion 11a4 facing to an end face 14a of the shield 14 is almost in parallel with the upper surface of the core layer 11a (see FIG. 2), and a distance D11a4 therebetween is, for example, 50 to 200 μm. At an upper surface of each side face 11a3, a strip-like side face zone CS (see a hatched zone in FIG. 5, and FIGS. 2 to 4) corresponding to the distance D11a4 is disposed. A lower surface US of each second protrusion 11a5 is almost in plane with the lower surface of the core layer 11a.

Areas excluding the side face zone CS at each side face 11a3 of the core layer 11a, the first protrusions 11a4 and the second protrusions 11a5 are covered with an outer cover 11p made of an insulating thermosetting synthetic resin including an epoxy resin, polyimide, a bismaleimide triazine resin or the above-described resin containing a reinforcing filler such as glass fiber (see FIGS. 2 to 4). A thickness of the outer cover 11p is almost same as the protruded dimension P11a4 of the first protrusion 11a4 and the protruded dimension P11a5 of the second protrusion 11a5, and has a thickness, for example, of 50 to 200 μm. End faces PS of the first protrusion 11a4 and end faces PS of the second protrusion 11a5 are exposed at each side face of the outer cover 11p (see FIGS. 2 and 3).

In addition, each face OS of each first protrusion 11a4 facing to the end face 14a of the shield 14 is almost in plane with the faces OS of the outer cover 11p facing to the end face 14a of the shield 14. Also, each face OS of each first protrusion 11a4 facing to the end face 14a of the shield 14 is adjacent to the faces OS of the outer cover 11p facing to the end face 14a of the shield 14. In other words, the end face 14a of the shield 14 is bonded to both of each face OS of each first protrusion 11a4 facing to the end face 14a of the shield 14 and the faces OS of the outer cover 11p facing to the end face 14a of the shield 14, and an end inner face (no symbol) of the shield 14 is bonded to the side face zone CS of the core layer 11a (see FIGS. 2 to 4). In contrast, as a position of each second protrusion 11a5 is lower than a position of each first protrusion 11a4, the shield 14 is not bonded to each second protrusion 11a5.

In each section structure shown in FIGS. 2 to 4, each mount component 12 is an electronic component such as a capacitor, an inductor, a resistor, a filter chip and an IC chip. One terminal of the mount component 12 is connected to the upper surface of the two conductor vias 11m among the four conductor vias 11m, and the other terminal of the mount component 12 is connected to the upper surface of the rest two conductor vias 11m. In order to connect each mount component 12 to the conductor via 11m, soldering such as a reflow method is utilized. Although two mount components 12 are shown in FIGS. 2 to 4, the number of the mount components 12 is not especially limited.

In each section structure shown in FIGS. 2 to 4, the sealing portion 13 is disposed at the upper surface of the substrate 11 with built-in component such that the sealing portion 13 covers the mount components 12. The sealing portion 13 is rectangular parallelepiped in appearance, and each side face is almost in plane with each end face of the insulation layers 11d to 11f. The sealing portion 13 is made of an insulating thermosetting synthetic resin including an epoxy resin, polyimide, a bismaleimide triazine resin or the above-described resin containing a reinforcing filler such as glass fiber, and its height is set such that the mount components 12 are fully covered.

In each section structure shown in FIGS. 2 to 4, the shield 14 is disposed such that the shield 14 covers the surface of the sealing portion 13 and side face zone CS of the core layer 11a of the substrate 11 with built-in component (see FIGS. 2 to 5). The shield 14 is rectangular parallelepiped in appearance (see FIG. 1), and each side face is almost in plane with each side face of the outer cover 11p and each end face of the insulation layers 11g to 11i. The shield 14 is made of a conductive thermosetting synthetic resin including an epoxy resin containing a conductive filler such as metal fibers, polyimide containing the conductive filler, a bismaleimide triazine resin containing the conductive filler, and has a thickness, for example, of 50 to 200 μm. Bonding of the shield 14 to the core layer 11a, each first protrusion 11a4 and the outer cover 11p is described above.

Method of Producing Electronic Circuit Module

Figure 6A:
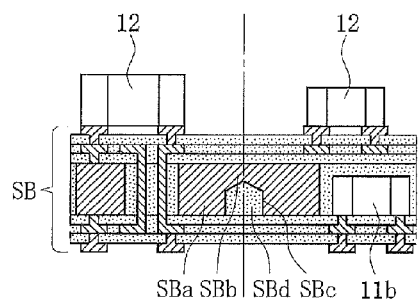
FIGS. 6A to 6C each is a view illustrating a method of producing the electronic circuit module shown in FIG. 1.
Figure 6B:
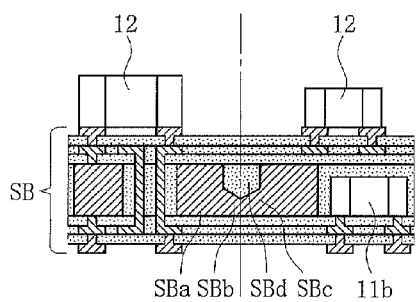
Figure 6C:
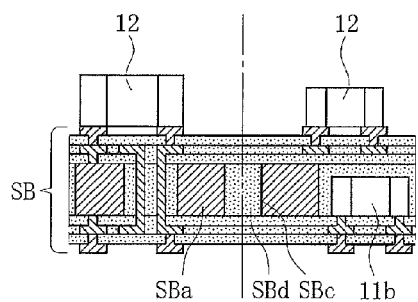

When the electronic circuit module 10 is produced, a multiple substrate SB where a plurality of substrates with built-in component 11 are connected in a matrix is prepared, as shown in FIGS. 6A, 6B and 6C. FIG. 6A is a major portion longitudinal sectional view of the multiple substrate SB having the section structure shown in FIG. 2. FIG. 6B is a major portion longitudinal sectional view of the multiple substrate SB having the section structure shown in FIG. 3. FIG. 6C is a major portion longitudinal sectional view of the multiple substrate SB having the section structure shown in FIG. 4.

In a core layer SBa of the multiple substrate SB, there are a connection portion SBb (see FIG. 6A) that is cut and forms one of the two first protrusions 11a4 shown in FIG. 2 and a connection portion SBb (see FIG. 6B) that is cut and forms one of the two second protrusions 11a5 shown in FIG. 3. At a lower side of the connection portion SBb shown in FIG. 6A, there is a concave portion including an inner face SBc corresponding to the side face 11a3. At an upper side of the connection portion SBb shown in FIG. 6B, there is a concave portion including an inner face SBc corresponding to the side face 11a3. Both concave portions are filled with an insulating material corresponding to the outer cover 11p. There are no connection portions SBb in FIG. 6C, the inner face SBc corresponding to the side face 11a3 is filled with the insulating material corresponding to the outer cover 11p. Then, the mount components 12 are mounted on the multiple substrate SB by a reflow solder method.

Figure 7A:
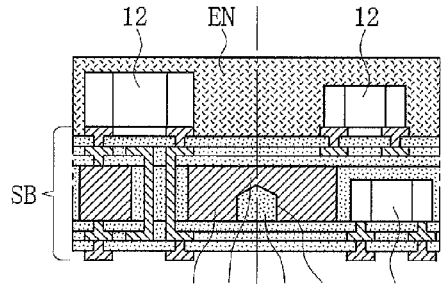
FIGS. 7A to 7H each is a view illustrating a method of producing the electronic circuit module shown in FIG. 1.
Figure 7B:
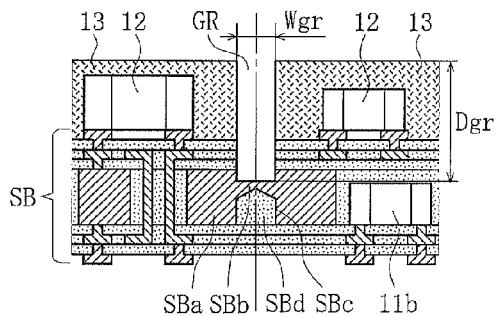
Figure 7C:
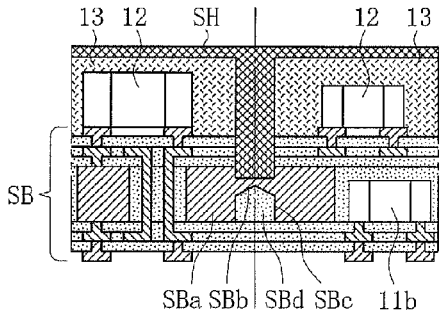
Figure 7D:
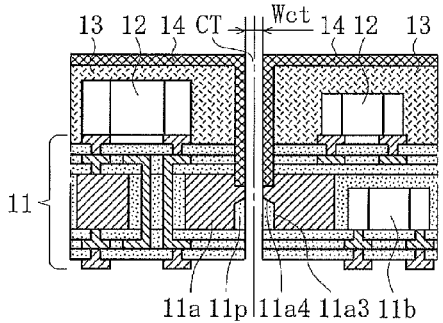
Figure 7E:
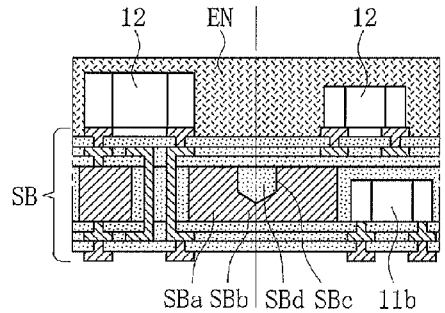

Next, an upper surface of the multiple substrate SB is coated with a sealing material EN corresponding to the sealing portion 13 to cover the mount components 12, and the sealing material EN is cured, as shown in FIGS. 7A and 7E.

Figure 7F:
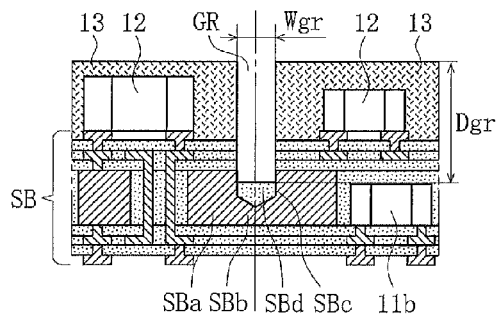

Then, a slit GR is formed from top to bottom at a boundary (see a dashed-dotted line) of each substrate 11 with built-in component using a dicing machine etc., as shown in FIGS. 7B and 7F. A width Wg of the slit GR substantially corresponds to a space facing the inner faces SBc each other corresponding to the side faces 11a3, and a depth Dgr is such that the slit GR enters into an upper surface of the connection portion SBb shown in FIG. 6A. In this way, the sealing portion 13 for each substrate 11 with built-in component is produced.

Figure 7G:
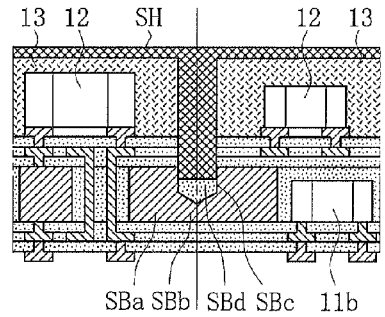
Figure 7H:
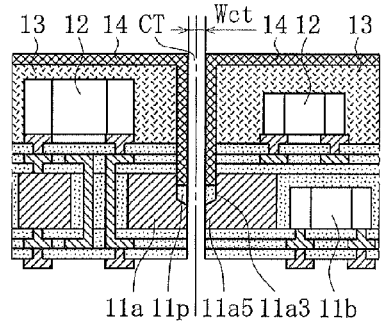

Next, as shown in FIGS. 7C and 7G, a shielding material SH corresponding to the shield 14 is coated and cured so that the sealing portion 13 of the multiple substrate is covered and the slit GR is filled. Then, as shown in FIGS. 7D and 7H, each substrate 11 with built-in component is cut at the boundary (see the dashed-dotted line) using a dicing machine etc. As a width Wct of a cut mark CT is smaller than a width Wgr of the slit GR, the first protrusions 11a4, the second protrusions 11a5 and the outer cover 11p remain on each substrate 11 with built-in component. Also, as a part of the connection portion SBb is cut upon the formation of the slit GR, cutting can be easily done as compared with the case that a part of the connection portion SBb is not cut.

Advantageous Effects of Electronic Circuit Module

Advantageous Effect 1

The circuit module 10 has a configuration that the substrate 11 with built-in component includes the core layer 11a made of a metal also functioning as the ground wiring, the outer cover 11p made of the insulating synthetic resin covering the side face 11a3 of the core layer 11a, and the two first protrusions 11a4 that protrude outwardly from each side face 11a3 of the core layer 11a and have the end faces PS integral with the core layer 11a exposed at the outer cover 11p, each face OS of each first protrusion 11a4 facing to the end face 14a of the shield 14 is adjacent to the faces OS of the outer cover 11p facing to the end face 14a of the shield 14, and the end face 14a of the shield 14 is bonded to both of the each face OS of each first protrusion 11a4 facing to the end face 14a of the shield 14 and the faces OS of the outer cover 11p facing to the end face 14a of the shield 14.

In other words, the end face 14a of the shield 14 can be bonded to the faces OS facing to the end face 14a of the shield 14 in the outer cover 11p made of the insulating synthetic resin with a strong bonding force by bonding of the synthetic resins, even when the shield 14 is made of the conductive synthetic resin. At the same time, based on this bonding, bonding of the end face 14a of the shield 14 and the faces OS facing to the end face 14a of the shield 14 in each first protrusion 11a4 made of a metal can be successfully maintained. In summary, the bonding of the shield 14 to each first protrusion 11a4 made of a metal is not easily degraded as time elapses, even when the shield 14 is made of the conductive synthetic resin. In this way, a decrease in conductivity between the shield 14 and each first protrusion 11a4 made of a metal is avoided to successfully maintain a shielding effect.

In addition, as the two first protrusions 11a4 are disposed at the side faces 11a3 of the core layer 11a, the end face 14a of the shield 14 and the faces OS facing to the end face 14a of the shield 14 in each first protrusion 11a4 made of a metal can be bonded successfully, a bond area is increased to enhance the conductivity between the shield 14 and each first protrusion 11a4 made of a metal.

Also, as each end face PS of each first protrusion 11a4 is exposed at the outer cover 11p, each end face PS of each first protrusion 11a4 can be used as the ground terminal

Advantageous Effect 2

The circuit module 10 has a configuration that there is the distance D11a4 between each face OS of each first protrusion 11a4 facing to an end face 14a of the shield 14 and one face in a thickness direction of the core layer 11a, the side face zone CS corresponding to the distance D11a4 is disposed at each side face 11a3 of the core layer 11a, the end face 14a of the shield 14 is bonded to both of each face OS of each first protrusion 11a4 facing to the end face 14a of the shield 14 and the faces OS of the outer cover 11p facing to the end face 14a of the shield 14, and the end inner face of the shield 14 is bonded to the side face zone CS of the core layer 11a.

In other words, the end face 14a of the shield 14 can be bonded to the face OS facing to the end face 14a of the shield 14 in the outer cover 11p made of the insulating synthetic resin with a strong bonding force by bonding of the synthetic resins, even when the shield 14 is made of the conductive synthetic resin. At the same time, based on this bonding, bonding of the end face 14a of the shield 14 and the face OS facing to the end face 14a of the shield 14 in each first protrusion 11a4 made of a metal, and bonding of the end inner face of the shield 14 and the side face zone CS can be successfully maintained. In summary, the bonding of the shield 14 to each first protrusion 11a4 made of a metal and the side face zone CS is not easily degraded as time elapses combining with an increase in the bond area, even when the shield 14 is made of the conductive synthetic resin. In this way, a decrease in conductivity between the shield 14 and each first protrusion 11a4 made of a metal is avoided to successfully maintain a shielding effect.

Advantageous Effect 3

The circuit module 10 has a configuration that the core layer 11a integrally has the two second protrusions 11a5 that protrude outwardly from each side faces 11a3, and each end face PS thereof is exposed at the outer cover 11p, the positions of the second protrusions 11a5 in the thickness direction of the core layer 11a are different from the positions of the first protrusions 11a4 in the thickness direction of the core layer 11a, and the shield 14 is not bonded to each second protrusion 11a5.

In other words, as the bonding force between each side face 11a3 of the core layer 11a and the outer cover 11p made of the insulating synthetic resin can be enhanced based on the bonding of the outer cover 11p and each second protrusion 11a5, the bonding force between the outer cover 11p and the each side face 11a3 of the core layer 11a is prevented from decreasing to avoid possible peeling, even when the shield 14 is made of the conductive synthetic resin.

In addition, as the two second protrusions 11a5 are disposed at each side face 11a3 of the core layer 11a, the bonding force is successfully increased by the second protrusions 11a5, and the bonding force between the outer cover 11p and the each side face 11a3 of the core layer 11a can be successfully prevented from decreasing.

Also, as each end face PS of each second protrusion 11a5 is exposed at the outer cover 11p, each end face PS of each second protrusion 11a5 can be used as the ground terminal

Alternative Embodiment of Electronic Circuit Module

Alternative Embodiment 1

In the above-mentioned <Structure of Electronic Circuit Module>, the two first protrusions 11a4 and the two second protrusions 11a5 are disposed at each side face 11a3 of the core layer 11a. However, the advantageous effects 1 to 3 can be similarly provided even when the total number of the first protrusions 11a4 and the second protrusions 11a5 is 2, 3, or 5 or more, the number of the first protrusions 11a4 and the second protrusions 11a5 disposed at each side face 11a3 is not the same or the first protrusions 11a4 and the second protrusions 11a5 are not arranged alternately. Also, although the core layer 11a has a substantially rectangular shape at the upper contour, the advantageous effects 1 to 3 can be similarly provided as long as the core layer 11a has similar the first protrusions 11a4 and the second protrusions 11a5, even when the upper contour has other shapes.

Alternative Embodiment 2

In the above-mentioned <Structure of Electronic Circuit Module>, the two first protrusions 11a4 and the two second protrusions 11a5 are disposed at each side face 11a3 of the core layer 11a. However, the advantageous effects 1 and 2 can be similarly provided even when the second protrusions 11a5 is removed from each side face 11a3, the total number of the first protrusions 11a4 is changed, or the upper contour of the core layer 11a is changed.

Alternative Embodiment 3

In the above-mentioned <Structure of Electronic Circuit Module>, the side face zone CS is disposed at each side face 11a3 of the core layer 11a. However, the advantageous effects 1 to 3 can be similarly provided even when the side face zone CS is excluded and each face of each first protrusion 11a4 facing to the end face 14a of the shield 14 is in plane with one face in a thickness direction of the core layer 11a, the total number of the first protrusions 11a4 is changed, or the upper contour of the core layer 11a is changed.

Alternative Embodiment 4

In the above-mentioned <Structure of Electronic Circuit Module>, three insulation layers (no symbols are added) are disposed at the upper surface (one face in a thickness direction) of the core layer 11a and three insulation layers (no symbols are added) are disposed at the bottom layer (the other face in the thickness direction) of the core layer 11a. However, the advantageous effects 1 to 3 can be similarly provided even when the number of the insulation layers is changed, or the number of the built-in component 11b and the mount components 12 is changed, i.e., the electronic circuit three-dimensionally constructed is changed as appropriate.

While the embodiments of the present disclosure are described, it should be appreciated that the disclosure is not limited to the above-described embodiments, and variations and modifications may be made without departing from the spirit and scope of the present disclosure.

What is claimed is:
1. An electronic circuit module, comprising:
a substrate with built-in component;
a mount component mounted on the substrate with built-in component;
a sealing portion covering the mount component; and
a shield made of a conductive synthetic resin covering the sealing portion,
the substrate with built-in component having a core layer made of a metal also functioning as ground wiring, an outer cover made of an insulating synthetic resin covering a side face of the core layer, and a first protrusion integrated with the core layer that protrudes outwardly from the side face of the core layer and has an end face exposed at the outer cover, a face of the first protrusion facing to an end face of the shield being adjacent to a face of the outer cover facing to the end face of the shield, and the end face of the shield bonded to both of the face of the first protrusion facing to the end face of the shield and the face of the outer cover facing to the end face of the shield.

2. The circuit module according to claim 1, wherein there is a distance between the face of the first protrusion facing to the end face of the shield and one face in a thickness direction of the core layer, a side face zone corresponding to the distance is disposed at a side face of the core layer, the end face of the shield is bonded to both of the face of the first protrusion facing to the end face of the shield and the face of the outer cover facing to the end face of the shield, and an end inner face of the shield is bonded to the side face zone.

3. The circuit module according to claim 1, wherein a plurality of the first protrusion is disposed at the side face of the core layer.

4. The circuit module according to claim 1, wherein the core layer has a second protrusion integrated with the core layer that protrudes outwardly from the side face of the core layer and has an end face exposed at the outer cover, a position of the second protrusion in a thickness direction of the core layer is different from a position of the first protrusion in the thickness direction of the core layer, and the shield is not bonded to the second protrusion.

5. The circuit module according to claim 4, wherein a plurality of the second protrusions is disposed at the side face of the core layer.

6. The circuit module according to claim 1, wherein the outer cover is made of at least one of a thermosetting synthetic resin and a thermosetting synthetic resin containing a reinforcing filler.

7. The circuit module according to claim 1, wherein the shield is made of a thermosetting synthetic resin containing a conductive filler.

* * * * *